US006265824B1

United States Patent

Helbig et al.

(10) Patent No.: US 6,265,824 B1
(45) Date of Patent: Jul. 24, 2001

(54) MINIATURE FILAMENT LAMP HAVING PLANAR CONTACT SURFACES ARRANGED ON THE PLANE BOTTOM SURFACE OF THE BASE

(75) Inventors: Peter Helbig, Sontheim; Hermann Steiner, Herbrechtingen, both of (DE)

(73) Assignee: Patent-Treuhand-Gesellschaft fuer elektrische Gluehlampen mbH, Munich (DE)

( * ) Notice: Subject to any disclaimer, the term of this patent is extended or adjusted under 35 U.S.C. 154(b) by 0 days.

(21) Appl. No.: 09/254,025

(22) PCT Filed: Jul. 2, 1998

(86) PCT No.: PCT/DE98/01830

§ 371 Date: Feb. 26, 1999

§ 102(e) Date: Feb. 26, 1999

(87) PCT Pub. No.: WO99/01913

PCT Pub. Date: Jan. 14, 1999

(30) Foreign Application Priority Data

Jul. 4, 1997 (DE) ............................................. 197 28 625

(51) Int. Cl.[7] ........................... H01K 01/50; H01J 17/20; H01J 61/12; H01J 17/16; H01J 61/30

(52) U.S. Cl. .......................... 313/578; 313/573; 313/634; 313/318.01; 313/318.05; 313/318.1; 439/57

(58) Field of Search .................................... 313/493, 634, 313/635, 569, 573, 574, 578, 318.01, 318.03, 318.05, 318.06, 318.1; 439/67, 76.1, 77, 56, 86, 544, 546, 547, 57

(56) References Cited

U.S. PATENT DOCUMENTS

| | | |
|---|---|---|
| 3,648,044 | 3/1972 | Barnard et al. . |
| 4,181,390 | 1/1980 | Aizawa . |
| 5,209,668 | 5/1993 | Higano et al. . |

FOREIGN PATENT DOCUMENTS

| | | |
|---|---|---|
| 29610849 | 10/1996 | (DE) . |
| 0139510 | 5/1985 | (EP) . |
| 1236261 | 6/1971 | (GB) . |
| 1247850 | 9/1971 | (GB) . |

*Primary Examiner*—Vip Patel
*Assistant Examiner*—Mack Haynes
(74) *Attorney, Agent, or Firm*—William E. Meyer

(57) ABSTRACT

The invention relates to a miniature incandescent lamp which is provided for mounting on a printed circuit board. According to the invention, the base contacts (7) have a plane contact surface (7*a*) for soldering onto a printed circuit board, a section (7*b*, 7*c*, 7*d*) which is constructed like tongs and serves to anchor the base contact (7) in the lamp base, and a hookshaped section (7*e*) into which one end of a supply lead (5) guided out of the lamp bulb (1) is inserted, and to which said supply lead (5) is welded.

2 Claims, 2 Drawing Sheets

Figure 1:
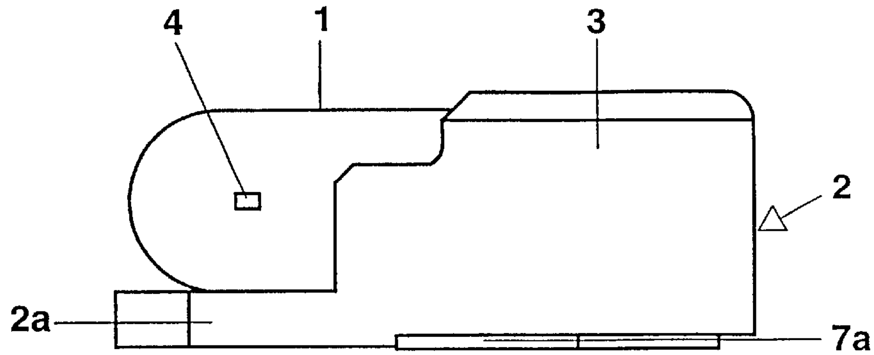

MINIATURE FILAMENT LAMP HAVING PLANAR CONTACT SURFACES ARRANGED ON THE PLANE BOTTOM SURFACE OF THE BASE

The invention relates to a miniature incandescent lamp in accordance with the preamble of patent claim 1.

I. PRIOR ART

Such a miniature incandescent lamp is disclosed, for example, in German Utility Model G 296 10 849.9. The miniature incandescent lamp described in said printed publication is provided for mounting on a printed circuit board and has a base with two U-shaped electric base contacts, a cylindrical lamp bulb fixed in the base, and two supply leads which are guided out of the lamp bulb and are connected in an electrically conducting fashion to a U-shaped base contact. The U-shaped base contacts have a plane contact surface in each case.

II. DESCRIPTION OF THE INVENTION

It is the object of the invention is to provide a miniature incandescent lamp having improved base contacts.

This object is achieved according to the invention by means of the characterizing features of patent claim 1. Particularly advantageous embodiments of the invention are described in the subclaims.

The miniature incandescent lamp according to the invention has two electric base contacts fitted in each case with a plane contact surface. According to the invention, each base contact has an integrally formed section angled away from the plane contact surface and constructed like tongs. The section shaped like tongs ensures reliable anchoring of the base contact in the lamp base. Moreover, each base contact is fitted with an integrally formed hook-shaped section into which one of the supply leads is inserted in each case and fastened in an electrically conducting fashion. The hook-shaped sections of the base contacts permit reliable fastening and contact-making of the supply leads guided out of the lamp bulb to and with the base contacts. The base contacts are advantageously constructed in one piece in each case. The hook-shaped section of the base contact is advantageously integrally formed on the section of the base contact constructed like tongs. The miniature incandescent lamp according to the invention advantageously has a plane bottom surface in which the plane contact surfaces of the base contacts are advantageously arranged. It is thereby easier to mount the miniature incandescent lamp according to the invention on a printed circuit board.

III. DESCRIPTION OF THE PREFERRED EXEMPLARY EMBODIMENT

Figure 2:
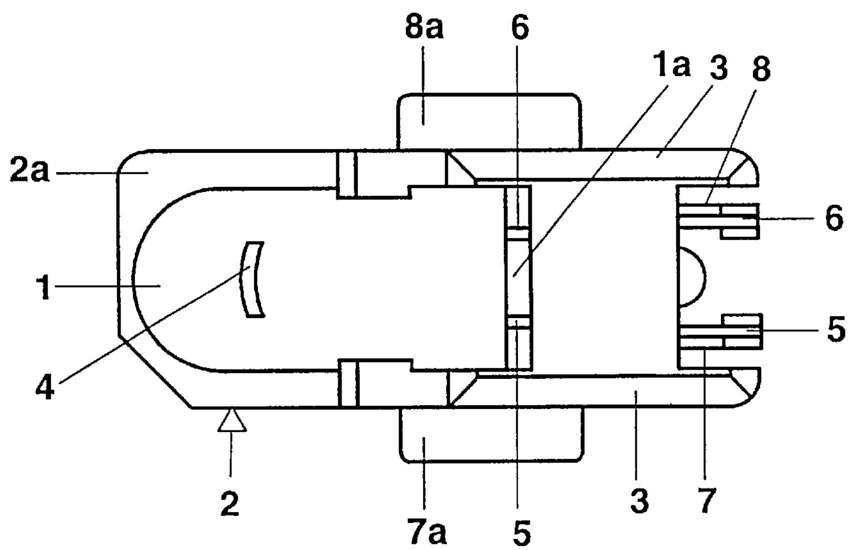
Figure 3:
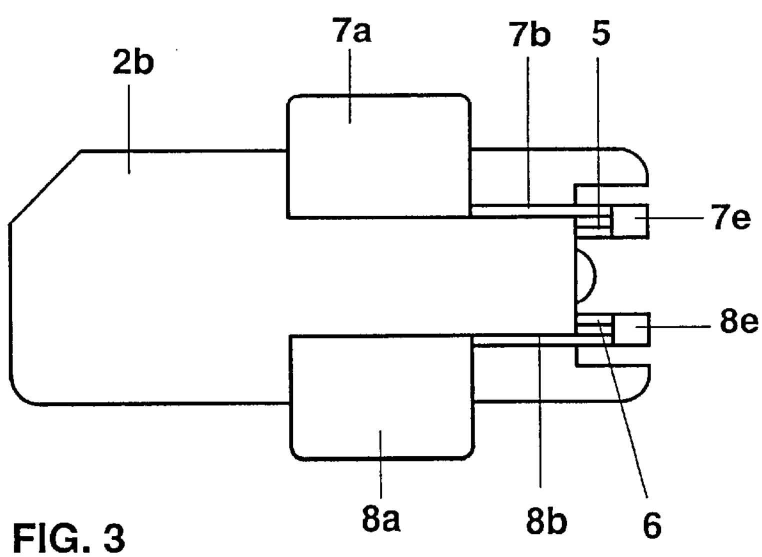
Figure 4:
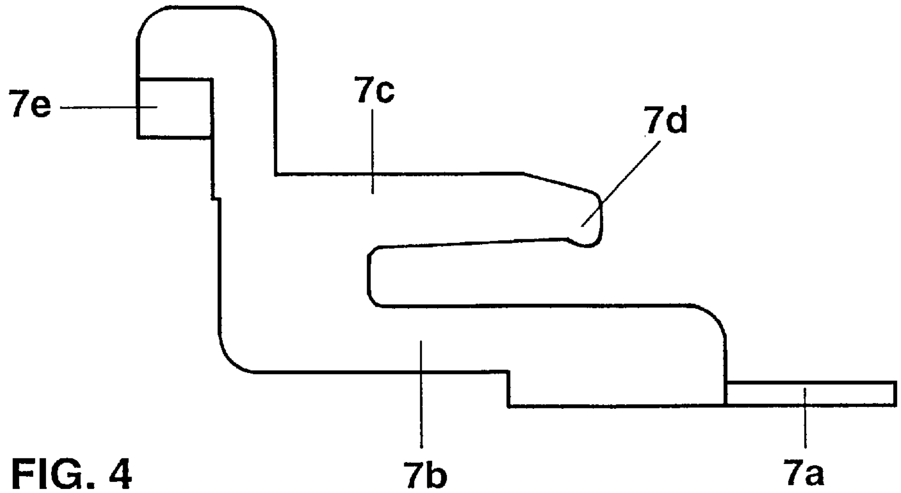
Figure 5:
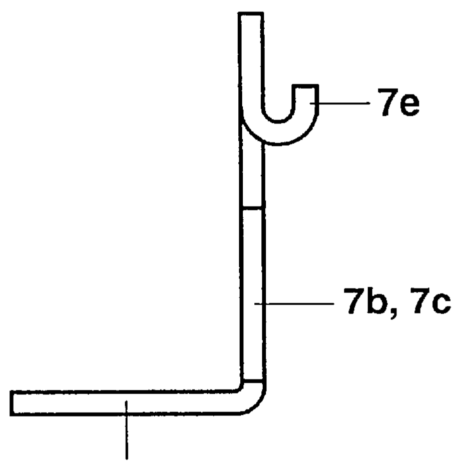
Figure 6:
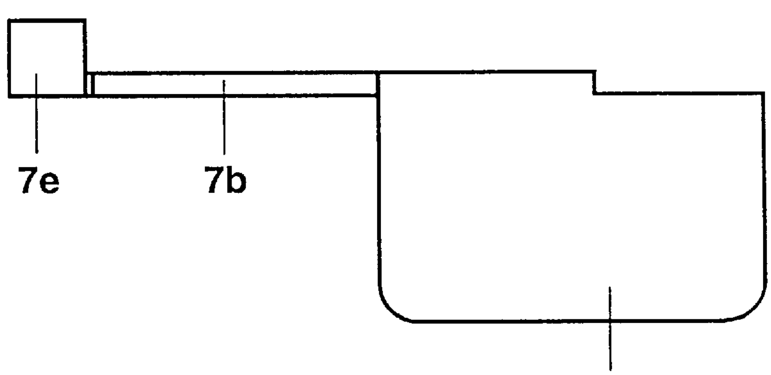

The invention is explained in more detail below with the aid of a preferred exemplary embodiment. In the drawing:

FIG. 1 shows a side view of the miniature incandescent lamp in accordance with the preferred exemplary embodiment, FIG. 2 shows the topside of the miniature incandescent lamp illustrated in FIG. 1, FIG. 3 shows the underside of the miniature incandescent lamp illustrated in FIG. 1, FIG. 4 shows a side view of a base contact of the miniature incandescent lamp illustrated in FIG. 1, FIG. 5 shows the front side of the base contact illustrated in FIG. 4, and FIG. 6 shows the underside of the base contact illustrated in FIG. 4.

The miniature incandescent lamp, represented diagrammatically in FIGS. 1 to 3, in accordance with the preferred exemplary embodiment has a glass lamp bulb 1, which is essentially cylindrical and sealed by means of a pinched foot 1*a*, and a base 2 made from plastic. The lamp bulb 1 is arranged lying in a receptacle of the lamp base 2. The lamp base 2 has a bottom 2*a* with a plane bottom surface 2*b* and two side walls 3 which support the lamp bulb 1 in its position from three sides. Located in the interior of the lamp bulb 1 is an incandescent filament 4 which is supplied with electric energy by two supply leads 5, 6 guided out of the lamp bulb 2, and by two metal base contacts 7, 8.

The two base contacts 7, 8 have in each case a plane, rectangular contact surface 7*a*, 7*b* which are arranged in the bottom surface 2*b* of the base bottom 2*a* and serve for soldering the miniature incandescent lamp onto a printed circuit board (not illustrated). Moreover, each base contact 7, 8 has a section 7*b*, 7*c*, 8*b*, 8*c* which is constructed like tongs and whose lower limb 7*b*, 8*b* is integrally formed on the contact surface 7*a*, 8*a* and is angled away perpendicularly therefrom. The section 7*b*, 7*c*, 8*b*, 8*c* constructed like tongs serves to anchor the base contact 7, 8 in the lamp base 2. A latching nose 7*d* is also provided on the upper limb 7*c*, 8*c* of the section 7*b*, 7*c*, 8*b*, 8*c* constructed like tongs. Furthermore, the base contacts 7, 8 in each case have a hook-shaped section 7*e*, 8*e* which is integrally formed on the upper limb 7*c*, 8*c* of the respective base contact 7, 8. One end of the supply leads 5, 6 is inserted in each case into the hook-shaped sections 7*e*, 8*e* of the base contacts 7, 8 and welded to the corresponding hook-shaped section 7*e*, 8*e*. The two metal base contacts 7, 8 are arranged with mirror symmetry relative to the two sides of the lamp bulb 1.

What is claimed is:

1. A miniature incandescent lamp for mounting on a printed circuit board, comprising: a base (2) with two electric base contacts (7, 8), the base contacts (7, 8) in each case having a plane contact surface **(7*a*, 8*a*) accessible for mounting on a printed circuit board, a lamp bulb (1) fixed to the base (2) and with a luminous means (4) arranged therein, two supply leads (5, 6), guided out of the lamp bulb (1), for the luminous means (4), the supply leads (5, 6) being connected in each case in an electrically conducting fashion to one of the electric base contacts (7, 8), wherein each electric base contact (7, 8) has an integrally formed section (7*b*, 7*c*, 8*b*, 8*c*) which is angled off from its plane contact surface (7*a*, 8*a*), constructed like tongs and anchored in the base (2), each base contact (7, 8) has a hook-shaped section (7*e*, 8*e*) into which one of the supply leads (5, 6) is inserted in each case and fastened in an electrically conducting fashion, and wherein the base (2) has a plane bottom surface (2*b*), and the plane contact surfaces (7*a*, 8*a*) of the electric base contacts (7, 8) are arranged in the plane bottom surface (b) of the base (2)**.

2. A miniature incandescent lamp for mounting on a printed circuit board, comprising: a base (2) with two electric base contacts (7,8), the base contacts (7,8) in each case having a plane contact surface **(7*a*,8*a*) accessible for mounting on a printed circuit board, a lamp bulb (1) fixed to the base (2) and with a luminous means (4) arranged therein, two supply leads (5,6) guided out of the lamp bulb (1), for the luminous means (4), the supply leads (5,6) being connected in each case in an electrically conducting fashion to one of the electric base contacts (7,8) wherein each base contact (7,8) has a hook-shaped section (7***e*,8*e*) into which one of the supply leads (5,6) is inserted in each case and fastened in an electrically conducting fashion, wherein the base (2) has a plane bottom surface (2*b*), and the plane contact surfaces (7*a*,8*a*) of the electric base contacts (7,8) are arranged in the plane bottom surface (b) of the base (2), and wherein the case of each base contact (7,8) the hook-shaped section (7*e*,8*e*) is integrally formed on the section (7*b*,7*c*,8*b*,8*c*) constructed like tongs.

* * * * *